(12) United States Patent
Huang et al.

(10) Patent No.: US 7,363,552 B2
(45) Date of Patent: Apr. 22, 2008

(54) METHOD AND APPARATUS FOR CONVOLUTIONAL INTERLEAVING/DE-INTERLEAVING TECHNIQUE

(75) Inventors: Wei-Hung Huang, Hsinchu (TW);
Hsi-Chia Chang, Keelung (TW);
Ching-Chieh Wang, Ilan County (TW)

(73) Assignee: Mediatek Inc., Hsin-Chu (TW)

( * ) Notice: Subject to any disclaimer, the term of this patent is extended or adjusted under 35 U.S.C. 154(b) by 470 days.

(21) Appl. No.: 11/132,354

(22) Filed: May 18, 2005

(65) Prior Publication Data
US 2005/0262415 A1  Nov. 24, 2005

(30) Foreign Application Priority Data
May 19, 2004 (TW) ............................... 93114170 A

(51) Int. Cl.
*G11C 29/00* (2006.01)
(52) U.S. Cl. .................................... 714/702
(58) Field of Classification Search ............... 714/702, 714/701, 755, 746, 786
See application file for complete search history.

(56) References Cited

U.S. PATENT DOCUMENTS 5,592,492 A    1/1997   Ben-Efraim et al.
5,745,497 A    4/1998   Ben-Efraim et al.

*Primary Examiner*—Shelly A Chase
(74) *Attorney, Agent, or Firm*—Hoffman, Warnick & D'Alessandro LLC

(57) ABSTRACT

The invention relates to the processor for performing convolution interleaving/de-interleaving on data symbols on plural original data symbols and convolution de-interleaving on the convolution interleaved data symbols. The processor for performing convolution interleaving on data symbol comprises a memory, an original address generator, and a storage address generator which generates an original address. The storage address generator generates the storage address of each of the stored plural data symbols in the memory according to the original address and a first predetermined sequence, and each of the convolution interleaved data symbols is stored in the memory according to the storage address; furthermore, all stored data symbols in the memory are configured into a circular structure.

32 Claims, 14 Drawing Sheets

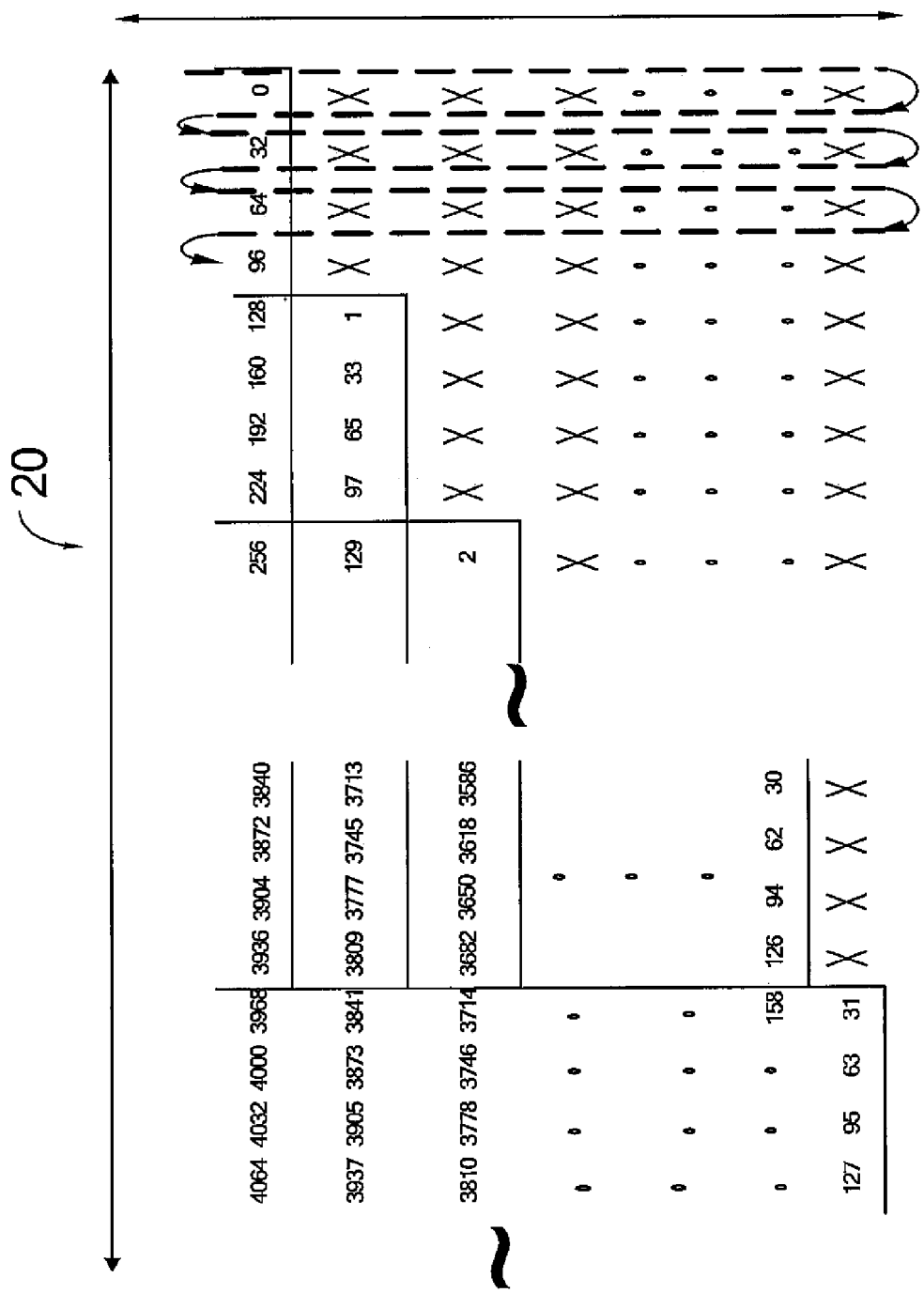

METHOD AND APPARATUS FOR CONVOLUTIONAL INTERLEAVING/DE-INTERLEAVING TECHNIQUE

BACKGROUND OF THE INVENTION

1. Field of the Invention

This present invention relates to a processor for performing convolutional interleaving/de-interleaving on data symbols; especially, the processor performs convolution interleaving on original data symbols and then convolution de-interleaving on the convolution interleaving data symbols to obtain the complete original data symbols.

2. Description of the Prior Art

The main objective of the system of interleaving/de-interleaving is to reduce burst error effect, which occurs during the transmission process, so as to decrease transmission data error. In the prior art, the technique of interleaving/de-interleaving data symbol uses the reading/writing of data symbols to perform the function of interleaving/de-interleaving data symbols. A schematic diagram of the method of the block interleaving/de-interleaving data symbol in the prior art is shown in FIG. 1(a) and FIG. 1(b).

In another prior art, the technique of interleaving/de-interleaving is the technique of convolution interleaving/de-interleaving. Compared with the method of block interleaving/de-interleaving, this method can utilize less registers to achieve the purpose of interleaving/de-interleaving data symbols. As shown in FIG. 2, FIG. 2(a) is a schematic diagram of the embodiment of convolution interleaving. The data matrixes obtain delay through several registers to achieve the purpose of interleaving data symbol. When I number of data symbols ($X_0$, $X_1$, $X_2$ . . . $X_{I-1}$) are first written into the memory, because the register causes the delay effect, only the value $X_0$ is being interleaved in the beginning. By repeating the above steps, each data symbol can be interleaved according to the sequence. The reverse method is used to perform de-interleaving. As shown in FIG. 2(b), FIG. 2(b) is the schematic diagram of the embodiment of convolution de-interleaving. De-interleaving is performed on the interleaved data symbols by the opposite arrangement of the registers.

However, the method of utilizing registers to perform convolution interleaving/de-interleaving data symbol by needs larger hardware circuit. The method is not economical. In another prior art, the memory is used as the processor for performing convolution interleaving/de-interleaving data symbol, which can save hardware circuit as compared with utilizing registers. However, this method involves complicated address operation; the operation of the writing address is different from that of the storing address, and the complicated relation among column, row, and block must be put into consideration. The memory capacity needs to double in order to simplify address operation.

Therefore, the main objective of the present invention is to provide a processor for performing convolution interleaving/de-interleaving of data symbols. It further provides the method for saving memory capacity and simplifying complicated operation to solve the problem in the prior art.

SUMMARY OF THE INVENTION

The main objective of the present invention is to provide a processor for performing convolution interleaving/de-interleaving on data symbol to reduce the memory size needed in the process of convolution interleaving/de-interleaving data symbols and to decrease the complexity and difficulty of the operation.

The processor for performing convolution interleaving on data symbols of the present invention is used to perform convolution interleaving on a sequence of original data symbols to obtain convolution interleaved data symbols.

The processor for performing convolution de-interleaving on data symbols of the present invention is used to perform convolution de-interleaving on a sequence of convolution interleaved data symbols to obtain the complete original set of data symbols.

The processor of the present invention comprises a memory, an initial address generator, and a memory address generator. The original address generator is used to generate the original address of the data symbols that are stored in the memory. The storage address generator generates the storage address of each of the plurality of convolution interleaved data symbols stored in the memory, according to the original address and a predetermined sequence. Furthermore, each of the plurality of convolution interleaved data symbols is stored in the memory according to the storage address.

When the processor receives the sequence of convolution interleaved data symbols, the first data symbol is stored in the original address in the memory according to the original address generated by the original address generator. Other data symbols are written into the memory according to a first predetermined sequence and the corresponding addresses stored in the memory, which are generated by the storage address generator for each of the data symbols. The first predetermined sequence is the sequence of data transmission. The plurality of convolution interleaved data symbols stored in the memory are configured in a circular data structure.

The processor further reads out data symbols stored in the memory according to a second predetermined sequence and the read initial address generated by the original address generator; therefore, the obtained sequence of data symbols are de-interleaved data symbols. In other words, the de-interleaving data symbols are the original data symbols.

The processor for performing convolution de-interleaving on data symbols in the application of the invention utilizes the memory to process data, and it can perform convolution interleaving/de-interleaving on data symbols through simple operation to obtain the complete set of original data symbols. The space and the capacity for performing interleaving data symbol needed by the registers in the prior art are reduced; therefore, the invention can reduce the space and the capacity needed in the memory and can decrease the complexity and difficulty of the operation.

The advantage and the spirit of the invention may be understood by the following recitations together with the appended drawing.

BRIEF DESCRIPTION OF THE APPENDED DRAWINGS

FIG. 1(a) and FIG. 1(b) are the schematic diagrams of the method of the block interleaving/de-interleaving data symbols in the prior art.

FIG. 4 is a schematic diagram of the first predetermined sequence of the processor for performing convolution de-interleaving on data symbols of the present invention.

DETAILED DESCRIPTION OF THE INVENTION

Figure 3:
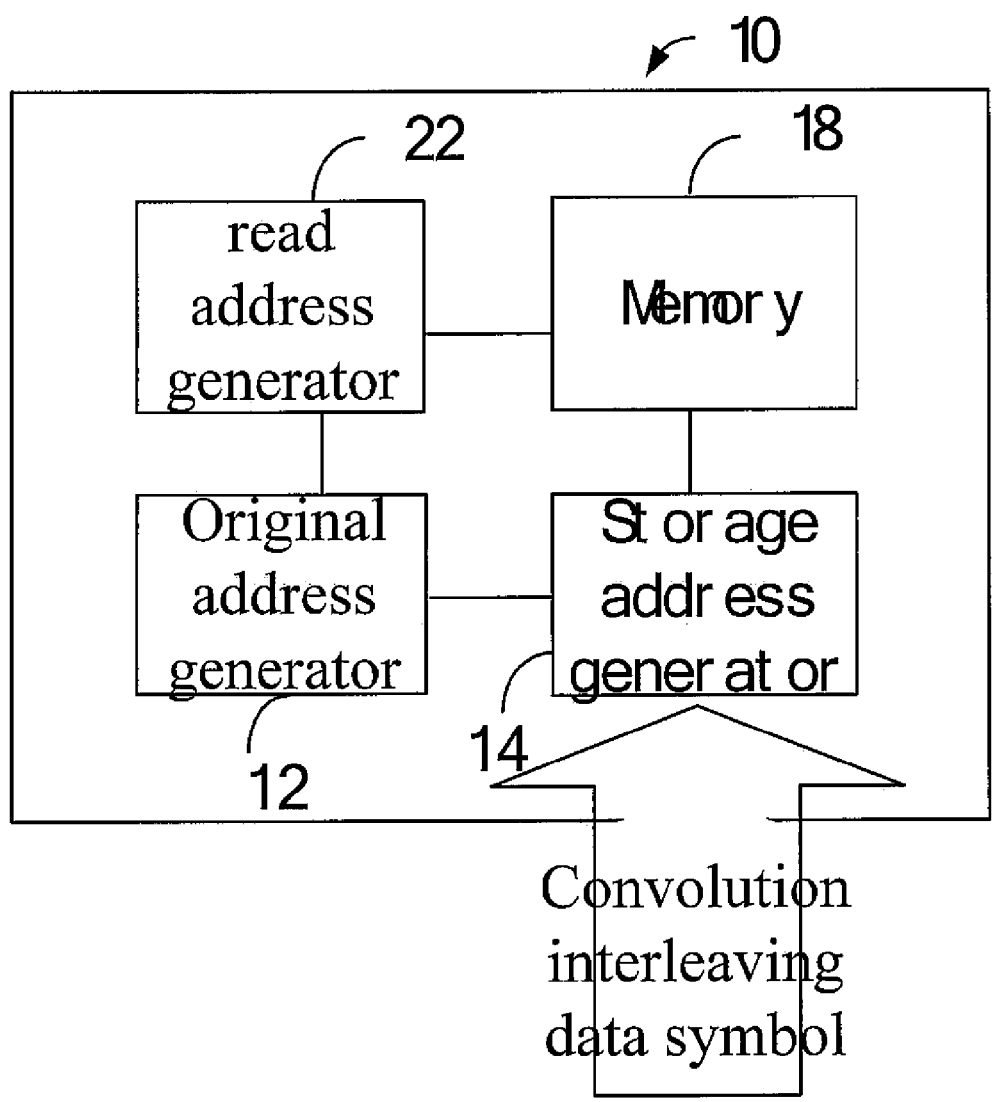
FIG. 3 is a block diagram of the processor for performing de-interleaving on data symbols of the present invention.

Please refer to FIG. 3. FIG. 3 is a block diagram of the processor 10 for performing convolution de-interleaving on data symbols in the present invention. The processor 10 of this embodiment performs convolution de-interleaving on a plurality of convolution interleaved data symbols. The processor 10 comprises a memory 18, an original address generator 12, and a storage address generator 14. The memory 18 stores each of the plurality of convolution interleaved data symbols. The original address generator 12 generates an original address to store a first data symbol. The storage address generator 14 generates a storage address, which is stored in the memory 18, for each of the plurality of convolution interleaved data symbols according to the original address and a first predetermined sequence, and each of the plurality of convolution interleaved data symbols is stored in the memory according to the storage address.

Please refer to FIG. 4. FIG. 4 is a schematic diagram of a first predetermined sequence of the processor 10 for performing convolution de-interleaving on data symbols in the present invention. In the embodiment, a plurality of convolution interleaved data symbols can be arranged and shown as a virtual input data block 20. The length of the input data block 20 depends on the number of the data. If the number of the data to be de-interleaved approaches infinite, the length of the input data block 20 can be made correspondingly infinite. The height of the input data block 20 is the period J of the de-interleaving. In the actual system application, the first predetermined sequence is the order of data being transmitted into the processor 10 for performing convolution de-interleaving. The content of the virtual input data block 20 can be taken as the data symbols for being transmitted into the processor 10 for performing convolution de-interleaving according to the first sequence. The element of the input data block 20 is represented in numerical symbols; therefore, the element is a symbol, and the number size shows the sequential order of the positions of the original data symbols before convolution interleaving is performed. The symbol 'x' is shown as redundant information. The first predetermined sequence inputs each element in the input data block 20 into the processor 10 from top to bottom and from left to right, according to the direction of the arrows in FIG. 4, and the storage address generator 14 generates the storage address for storing each of the data symbols in the memory 18 according to the first predetermined sequence. Please refer to FIG. 3. After the data symbols are inputted in sequence into the processor 10, the data symbols are stored in the memory 18 correspondingly based on the addresses generated by the storage address generator 14.

Figure 5A:
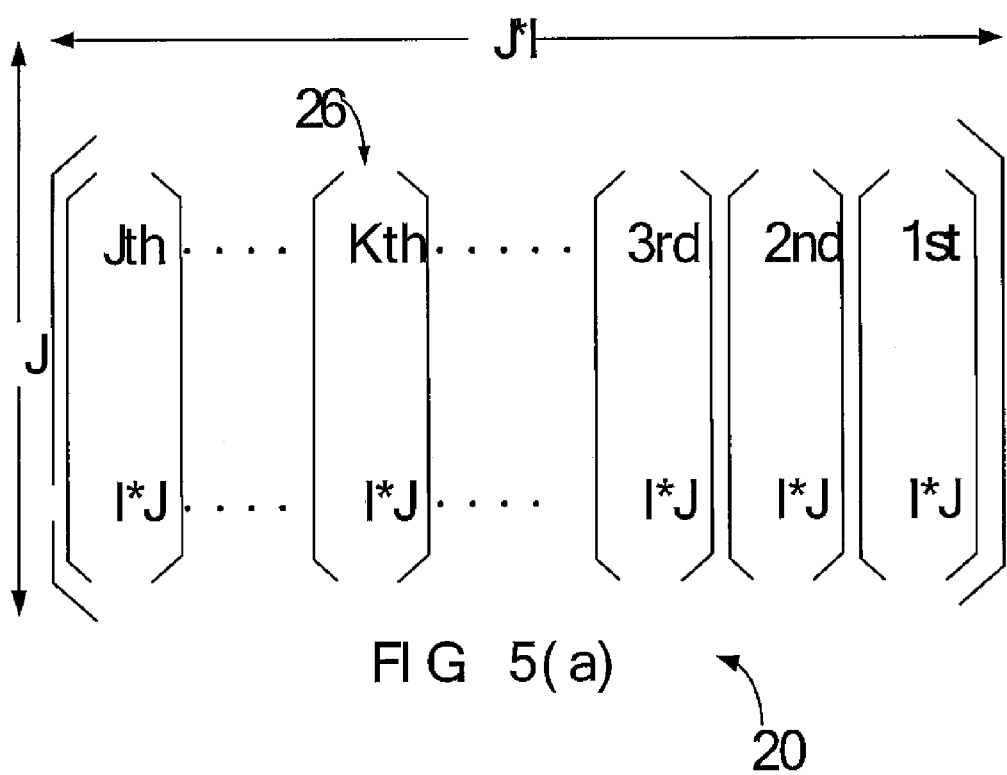
FIG. 5(a) is a schematic diagram of a data symbol input data block including the J sub-matrix of the processor for performing convolution de-interleaving on data symbols in the invention.
Figure 5B:
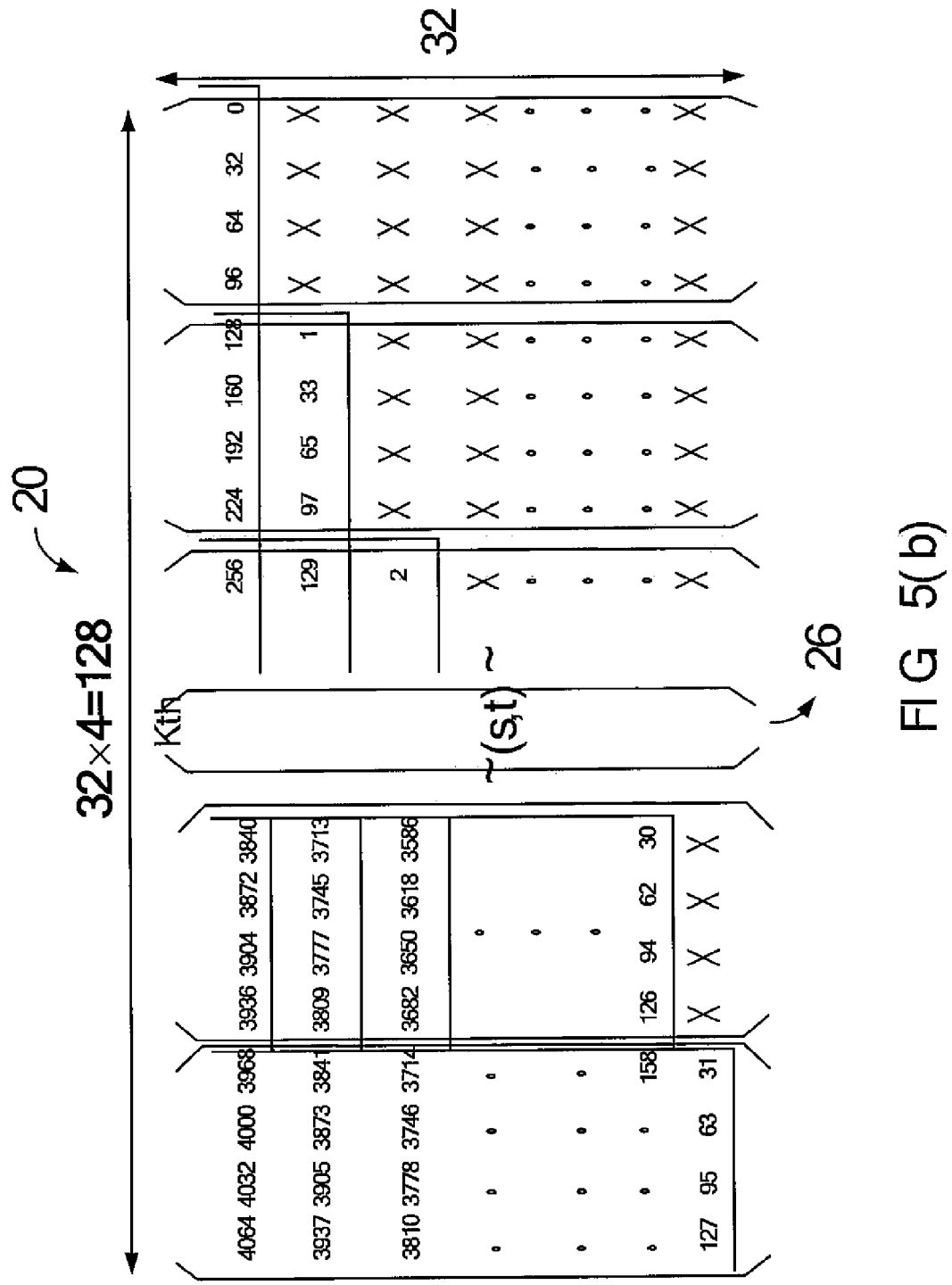
FIG. 5(b) is a schematic diagram of an input data block of the processor for performing convolution de-interleaving on data symbols in the invention.

Please refer to FIG. 5(a). In the input data block 20 formed by the plurality of convention interleaved data symbols, every I columns can be further grouped into a sub-matrix. Each of the sub-matrixes comprises J*I data symbols; for example, a k-th sub-matrix 26 of the J sub-matrixes comprises J*I data symbols, wherein k is any integer selected from 1 to J, J is the number of rows in the k-th sub-matrix 26, and I is the number of columns in the k-th sub-matrix 26. For example, when J=32 and I=4, the input data block 20 is shown in FIG. 5(b), wherein a first set of sub-matrix comprises four symbols and (32−1)*4 redundant information in the first row, while the k-th sub-matrix 26 comprises (k*4) symbols and (32−k)*4 redundant information. When it comes to the J-th sub-matrix and the sub-matrix after it, there is no redundant information. As mentioned above, the element of the input data block 20 is represented in the numerical symbols, so the element is a symbol, and the number shows the sequential order of the positions of the original data symbols before convolution interleaving is performed, while the symbol of "x" represents a redundant information.

Figure 6:
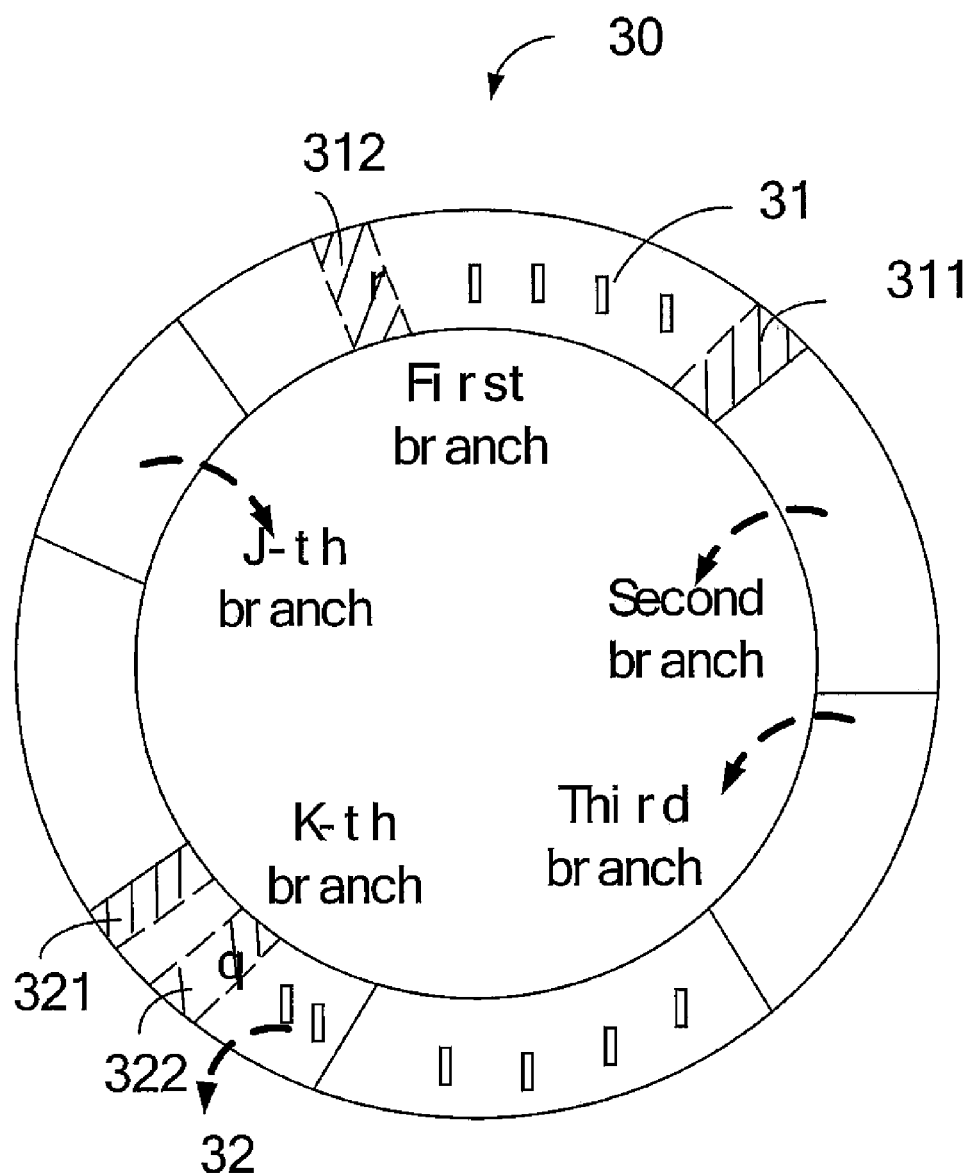
FIG. 6 is a schematic diagram of the addresses of the memory of the processor for performing convolution de-interleaving on data symbols of the present invention.

Please refer to FIG. 6. FIG. 6 is a schematic diagram of the addresses of the memory 18 of the processor 10 for performing convolution de-interleaving on data symbols. All the data symbols stored in the memory 18 are configured into a circular data structure 30; the memory 18 comprises J memory branches. According to the number value of the element in the input data block 20 in FIG. 5(a), the first memory branch 31 in the memory 18 comprises J*I memory units, and the second memory branch comprises (J−1)*I memory units; thereby the k-th memory branch 32 comprises (J−k+1)*I memory units. For example, when J=32 and I=4, the memory 18 comprises 32 memory branches; the first memory branch 31 comprises 32*4 memory units, and the second memory branch comprises 31*4 memory units, while the 32-th memory branch comprises 1*4 memory units.

Please refer to FIG. 6. The original address generated by the original address generator 12 is the address of the first memory unit 311 of the first memory branch 31, and the address of an r-th memory unit 312 of the first memory branch 31 is obtained by subtracting the original address by (r−1), wherein r is an integer selected from 1 to J*I. The address of the first memory unit 321 of the k-th memory branch 32 is obtained by adding $$\left[\sum_{p=1}^{k-1}(J-p)\right]*I$$

to the original address, and the address of the q-th memory unit 322 of the k-th memory branch 32 is obtained by adding $$\left\{\left[\sum_{p=1}^{k-1}(J-p)\right]*I-[q-1]\right\}$$

to the original address, wherein q is any integer selected form 1 to (J−k+1)*I. When it receives each of the data symbols in the J sub-matrixes according to the first predetermined sequence, the storage address generator 14 generates the corresponding storage addresses for each data symbol. Each of the data symbols is then stored in the above mentioned corresponding address in the memory 18, and they are configured into a circular data structure 30.

The storage address generator 14 relates the generated storage addresses of each data symbol with the corresponding positions of the data symbol in the input data block 20. Please refer to FIG. 5(*a*). FIG. 5(*a*) shows a data symbol on the s-th row and the t-th column in the k-th matrix 26; therefore, it is shown as the (s,t)-th data symbol, wherein s is any integer selected from 1 to J, and t is any integer selected from 1 to I. The storage address generator 14 based on k, s, and t to generate corresponding storage addresses. When s=1, the storage address generator generates the storage address of the first row of the (s,t)-th data symbol in the k-th sub-matrix according to a first formula; the first formula is shown as:

the first row write address=the write start address−
[((k−1)*I)+t−1].

That is, the first row write address in each column is the first row write address in the previous column minus 1. In practical implementation, the first row write address can also be recorded as the write start address, and the first row write address of the next column can be obtained by subtracting the new write start address by 1.

When s=2~J, the storage address generator generates the storage address of the (s,t)-th data symbol of the k-th sub-matrix according to a second formula, and the second formula is shown as:

$$\text{the write address} = \text{the first row write address} + \left[\sum_{w=1}^{s-1}(J-w)+1\right]*I$$

Each of the data symbols of the input data block 20 is stored into the memory according to the first predetermined sequence and the corresponding storage address generated by the storage address generator 14. For example, when J=32 and I=4, the storage address of the (1,1)-th data symbol in the first sub-matrix is the original address; the storage address of the (2,1)-th data symbol in the first sub-matrix is the original address+(32−1)*4; the storage address of the (3,1)-th of the data symbol in the first sub-matrix is the original address+[(32−1)+(32−2)]*4, i.e. the storage address of the previous data symbol (2,1)+(32−2)*4, and so on.

Every new storage address is the storage address of the previous data symbol plus a fixed decremental offset. After it finishes storing the first column of element in the first sub-matrix, the storage address of the (1,2)-th data symbol in the first sub-matrix is the original first row write address−1 (i.e. the first row write address in the previous column−1); the storage address of the (2,2)-th of the data symbol in the first sub-matrix is the original−1+(32−1)*4; the storage address of the (3,2)-th data symbol in the first sub-matrix is the original address−1+[(32−1)+(32−2)]*4 (i.e. the storage address of the data symbol (2,2)+(32−2)*4), and so on. Coordinating with each address of the memory units in the above mentioned memory 18, all data symbols in the input data block 20 are stored in the memory 18. Although all redundant information is stored in the start, it will be replaced by follow-up data symbol later, until all elements in the input data block 20 have been processed by the processor 10; therefore, only the data symbols are still stored in the memory 18, and all stored data symbols in the memory 18 are configured into a circular data structure 30. The formula can be applied in either a counter-clockwise direction or a clockwise direction when the memory is reviewed as a cyclic structure. The first and second formulae can be correspondingly adjusted. In practical implementation, as long as the original address is obtained, the addresses for the following data symbols can be obtained by subtracting or adding the first row write address in the previous column by 1(s=1), or the previous storage address plus or minus a fixed decremental offset (s≠1). Only an adder and subtractor need to be put into the hardware of the address generator. That ie, it would not depart from the essence of the invention whether to write the memory from the front end or the back end. Only the formula would have to make a corresponding change. Moreover, where each block in the memory possesses additional buffering space, it still can be viewed as an equivalent embodiment to the present invention as long as the basic principle for generating the address is the same.

Besides writing the plural convolution interleaved data symbols into the memory 18, the processor 10 of the present invention can also comprise a read address generator 22. The read address generator 22 generates plural read addresses according to the original address, a second predetermined sequence, and a third formula of the original address generator 12, and it reads each of the stored data symbol in the memory 18 according to the plurality of read addresses.

The read address generator 22 reads all of the stored data symbols in the memory 18 according to the second predetermined sequence. The second predetermined sequence is mentioned in the following descriptions. First, the read address generator 22 reads 32 data symbols for four times, then 31 data symbols for four times, 30 data symbols for four times, . . . , and one data symbol for four times, so the stored data symbols in the memory 18 can be read completely. The read data symbol is the convolution de-interleaved data symbol. In the reading of 32*4 times, the first time starts at the original address, the second time starts at the original address−1, the third time starts at the original address−2, the fourth times starts at the original address−3, and the last time is the original address−127. The read address generator 22 reads each of the plural data symbols according to the third formula. The read address of the z symbols of the y th time is shown as:

$$[\text{original address} - (y-1)] + \left[\sum_{w=1}^{z-1}(J-w)\right]*I$$

Figure 7:
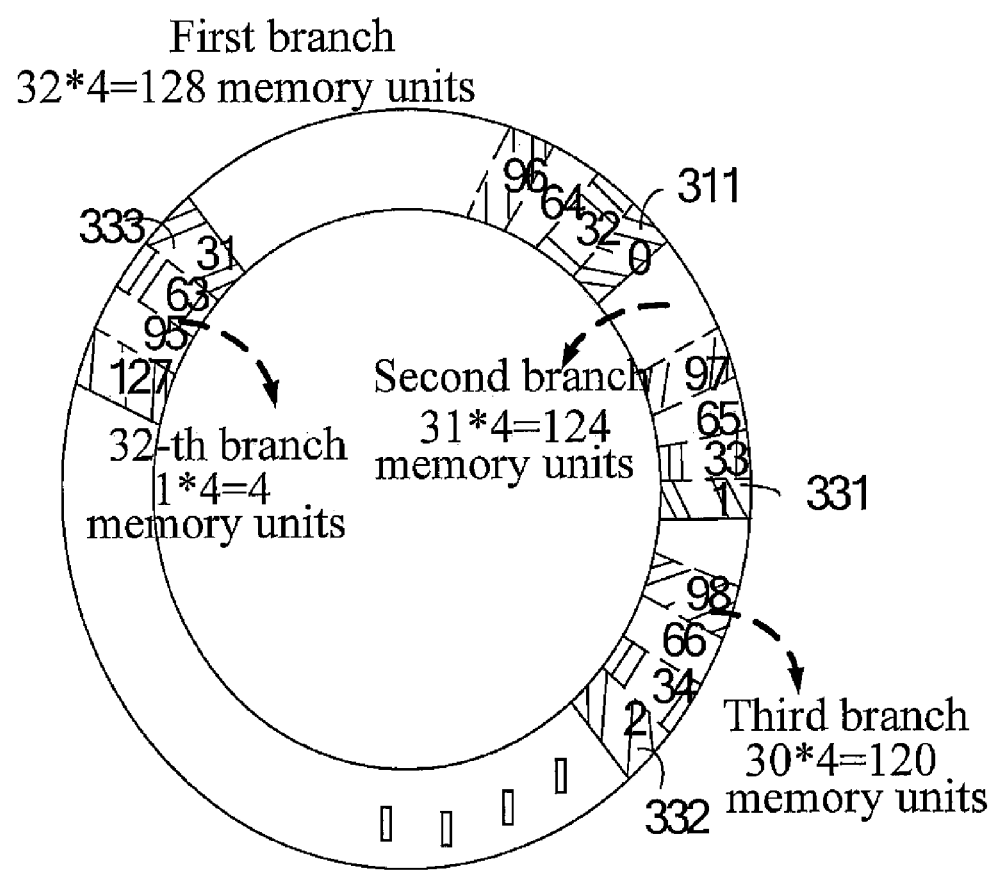
FIG. 7 is a schematic diagram of the reading process of the processor for performing convolution de-interleaving on data symbols of the present invention.

The [original address−(y−1)] represents the in start address being read at the y-th time; this start address is located in the first memory branch. Please refer to FIG. 7. FIG. 7 is a schematic diagram of the read process of the processor 10 for performing convolution de-interleaving on data symbols in the invention. For example, when J=32 and I=4, first, the processor 10 reads the first data symbol (i.e. number 0) of the original address 311 from the memory 18; next, the symbol (i.e. number 1) at the alternate position of (32−1)*4 memory units 331 is read; the symbol (i.e. number 2) at the separated position of (32−2)*4 memory units 331 is read, . . . , the symbol (i.e. number 31) at the separated position of (32−31)*4 memory units 331 is read, and so on. The number of symbols totals to 32. Second, the symbol of number 32 at the position of the original address−1 is read; the symbol of number 33 at the position of the original address−1+(32−1)*4 is read, and so on. Accordingly, 32 symbols are being continually read for four times, i.e. the symbols of number 1 to 31, number 32 to 63, number 64 to 95, and number 96 to 127. Because the 32nd memory branch has only four symbols, 31 symbols from the fifth to the eighth are read for four times, and 30 symbols from the ninth to the twelfth are read for four times, and so on. Therefore, all the stored data symbols in the memory 18 are completely being read, and the read data symbols are convolution de-interleaved data symbols. Similarly in practical implementation, according the essence of the proffered formula in the present invention, as long as the original address is obtained, the addresses for the following data symbols can be obtained by subtracting the first row write address in the previous column by 1(s=1), or the previous storage address plus a fixed decremental offset (s≠1). Only an adder and subtractor need to be put into the hardware of the address generator.

Please refer to FIG. 7. When the stored data symbols in the memory 18 are completely read for 31 times, it can be considered as the original address of the memory 18 of the complete circular data structure 30 has been shifted to the left for one memory unit; that is the original address−1. The original address is changed from the position of number 0 to the position of number 32; then, 31 symbols are read to shift the memory 18 to the left for one memory unit. The original address at which reading starts becomes the position of number 64. Through this property, the processor 10 for performing convolution de-interleaving on data symbols in the invention can process a sequence of data which is bigger in size than the circular data structure in the invention.

Figure 8:
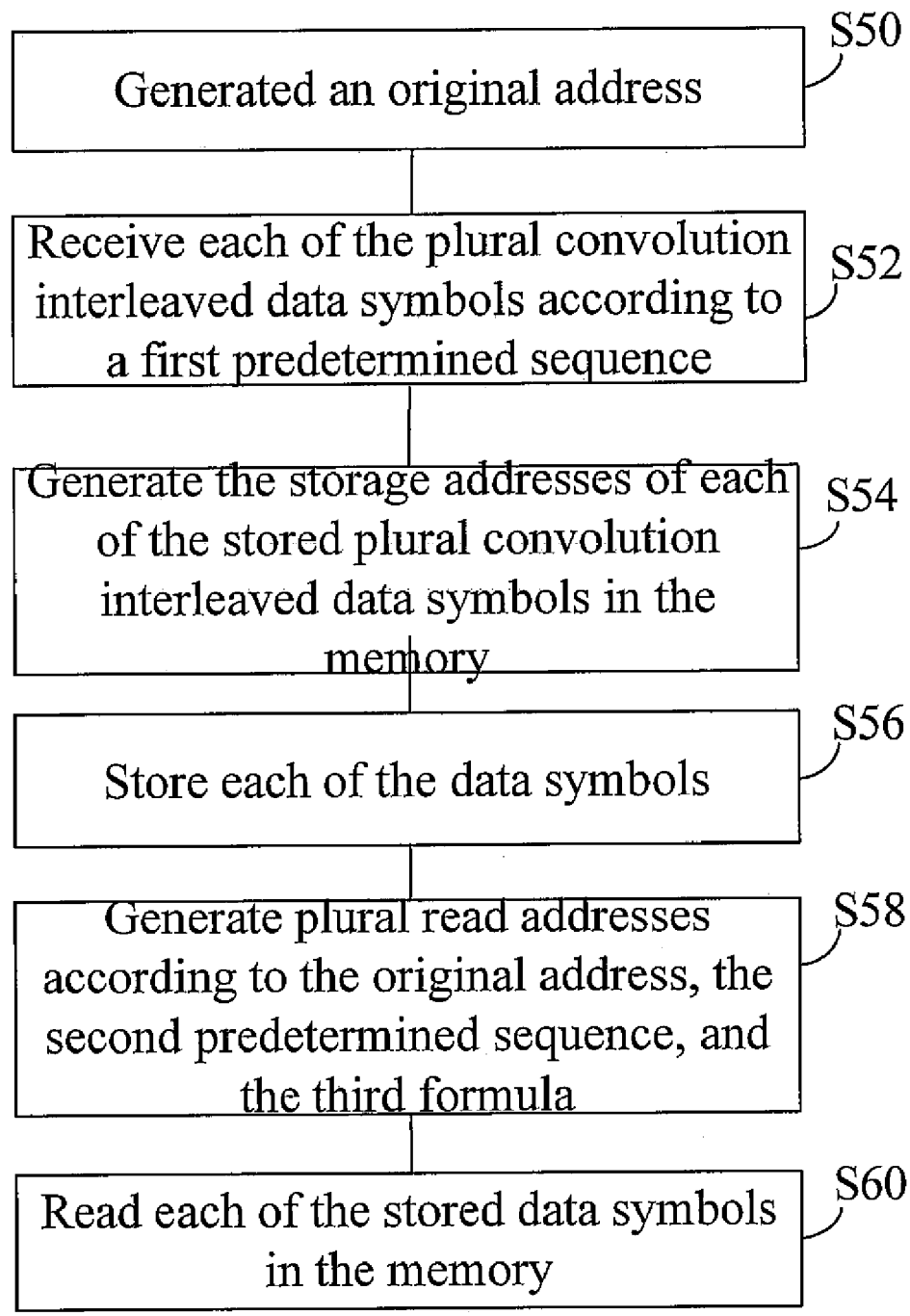
FIG. 8 is a flow chart of the method for performing convolution de-interleaving on data symbols of the present invention.

Please refer to FIG. 8. FIG. 8 is a flow chart of the method for performing convolution de-interleaving on data symbols, wherein the method for performing convolution de-interleaving on data symbols comprises the following steps:

S50: Generate a original address;

S52: Receive each of the plural convolution interleaved data symbols according to a first predetermined sequence;

S54: Generate the storage addresses of each of the stored plural convolution interleaved data symbols in the memory;

S56: Store each of the data symbols;

S58: Generate plural read addresses according to the original address, the second predetermined sequence, and the third formula; and S60: Read each of the stored data symbols in the memory 18;

The plural convolution interleaved data symbols are an input data block 20. The input data block 20 comprises more than J sub-matrixes wherein the kth sub-matrix 26 of the J sub-matrixes comprises J*I data symbols. k is any integers selected from 1 to J, J is the number of rows in the k-th sub-matrix 26, and I is the number of columns in the k-th sub-matrix 26. In this method, the memory 18 comprises J memory branches, and a k-th memory branch 32 of the J memory branches comprises (J−k+1)*I memory units. In this method, the original address is the address of the first memory unit 311 of the first memory branch 31, and the address of an r-th memory unit 312 of the first memory branch 31 is obtained by subtracting the original address by (r−1), wherein r is any integer selected form 1 to J*I; the address of the first memory unit 321 of the k-th memory branch 32 is obtained by adding $$\left[\sum_{p=1}^{k-1}(J-p)\right]*I$$

to the original address, and the address of the q-th memory unit 322 of the k-th memory branch 32 is obtained by adding $$\left\{\left[\sum_{p=1}^{k-1}(J-p)\right]*I - [q-1]\right\}$$

to the original address, wherein q is any integer selected form 1 to (J−k+1)*I.

Figure 1:
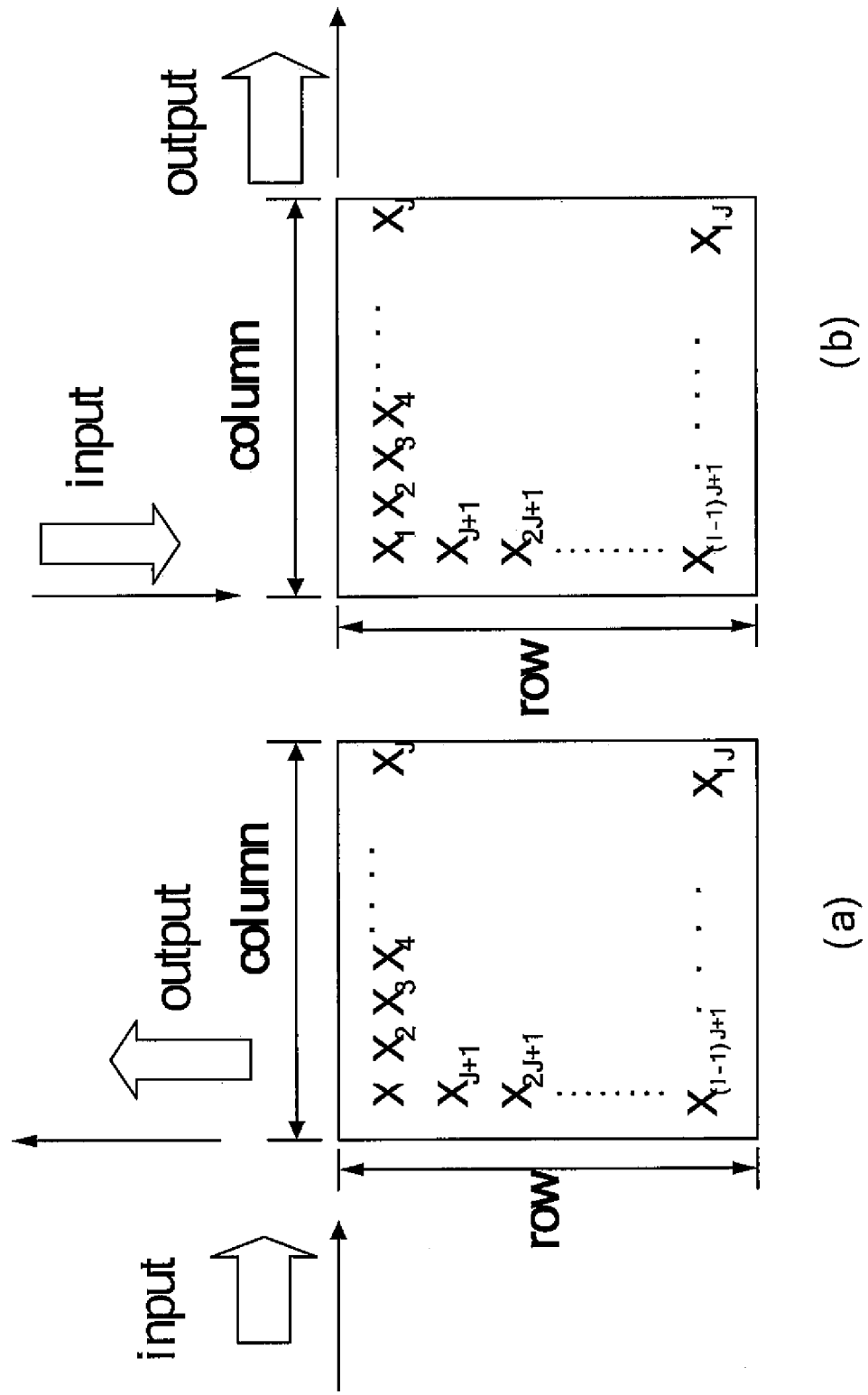
Figure 2:
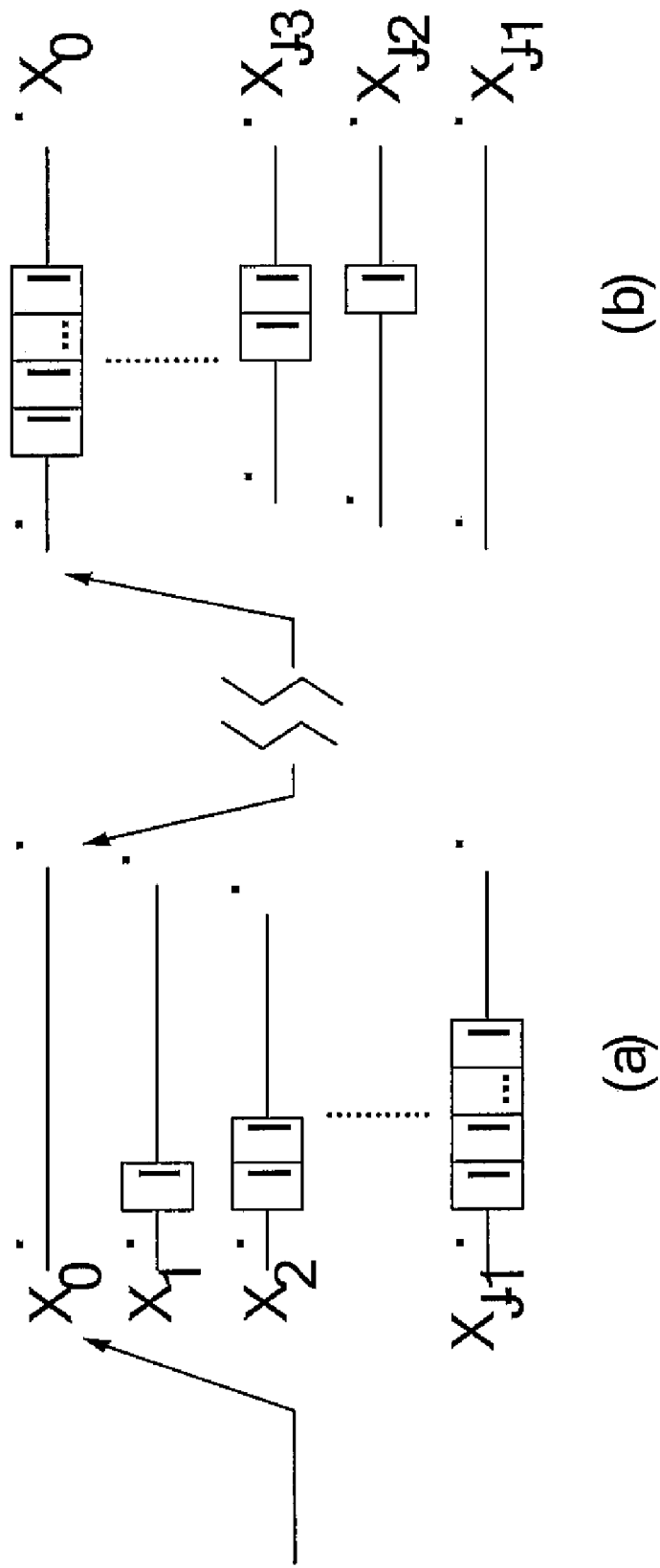
FIG. 2 is a schematic diagram of the method of the convolution interleaving/de-interleaving data symbols in the prior art.

The first sequence in the method is shown in FIG. 2. The received storage address of the (s,t)-th data symbol of the k-th sub-matrix 26 is shown in the following descriptions:

when s=1, the first row write address=the original address−[((k−1)*I)+t−1];

when s=2~J, $$\text{the storage address} = \text{the first row write address} + \left[\sum_{w=1}^{s-1}(J-w)+1\right]*I$$

Therefore, all of the data symbols of the input data block 20 are stored in the memory 18. All of the redundant information is stored in the beginning, but it will be replaced by incoming symbols later; therefore, when all of the elements in the input data block are processed, only all of the symbols are still in the memory 18. Furthermore, all of the symbols in the memory 18 are configured into a circular data structure 30.

The read method generates plural read addresses according to the original address, the second predetermined sequence, and the third formula. Also, it reads each of the stored data symbols in the J memory branch according to the plural read addresses.

The processor 10 reads the first symbol from the original address in the memory 18; it reads the second symbol in alternate position of (J−1)*I memory units, and it reads the third symbol in separated position of (J−2)*I memory units, . . . , it reads the J-th symbol in separated position of (J−(J−1))*I, and so on. The position of the original address-1 reads the (J+1)-th symbol, and the position of the original address-1+(J-1)*I reads the (J+2)-th symbol; therefore, it can continually read I times of J symbols, then it continually reads I times of J-1 symbols, and it continually reads I times of I-2 symbols, and so on. In this way, it can completely read all the stored data symbols in the memory 18, and the read data symbols are convolution de-interleaved data symbols.

In another embodiment of the invention, if the input data block 20 comprises more than J sub-matrixes, it only needs to write in the memory capacity of (J-1) sub-matrixes to achieve the function of convolution de-interleaving on data symbols. Because the sub-matrix after the J-th sub-matrix comprises J*I useful data symbols, it does not need to go through convolution de-interleaving and storing of data symbols, and it can be directly read out. This embodiment of the processor 10 for performing convolution de-interleaving on data symbols saves the most in the capacity of the memory 18 out of all the embodiments in the present invention; the memory 18 only needs to comprise J-1 memory branches, and the v-th memory branch of J-1 memory branches comprises (J-v+1)*I memory units, wherein v is any integer selected form 1 to J-1. For example, when J=32 and I=4, the input data block 20 is shown in FIG. 5(b). The processor 10 stores data symbols in the memory 18 according to the first to the 32nd sub-matrix in the sequence. When it stores the data symbols according to the 32nd sub-matrix, each of the elements is a symbol without any redundant information. Therefore, the 32nd sub-matrix does not need to perform convolution de-interleaving on data symbols, and it can be directly outputted. The memory 18 just needs (32-1) memory branches, so (32-1) sets of sub-matrix just needs the capacity of (32-1) sets of sub-matrix, and the processor can complete convolution de-interleaving on data symbols.

Compared with the prior art, the processor 10 for performing convolution de-interleaving on data symbols in the present invention utilizes the memory 18 to process data. The method just needs to perform simple operations to proceed convolution interleaving/de-interleaving on data symbols, so as to obtain the complete set of original data. Therefore, it reduces the space and the capacity in the memory 18 which is needed in the prior art when utilizing registers, and the invention can also reduce the complexity and difficulty in calculations.

Figure 9:
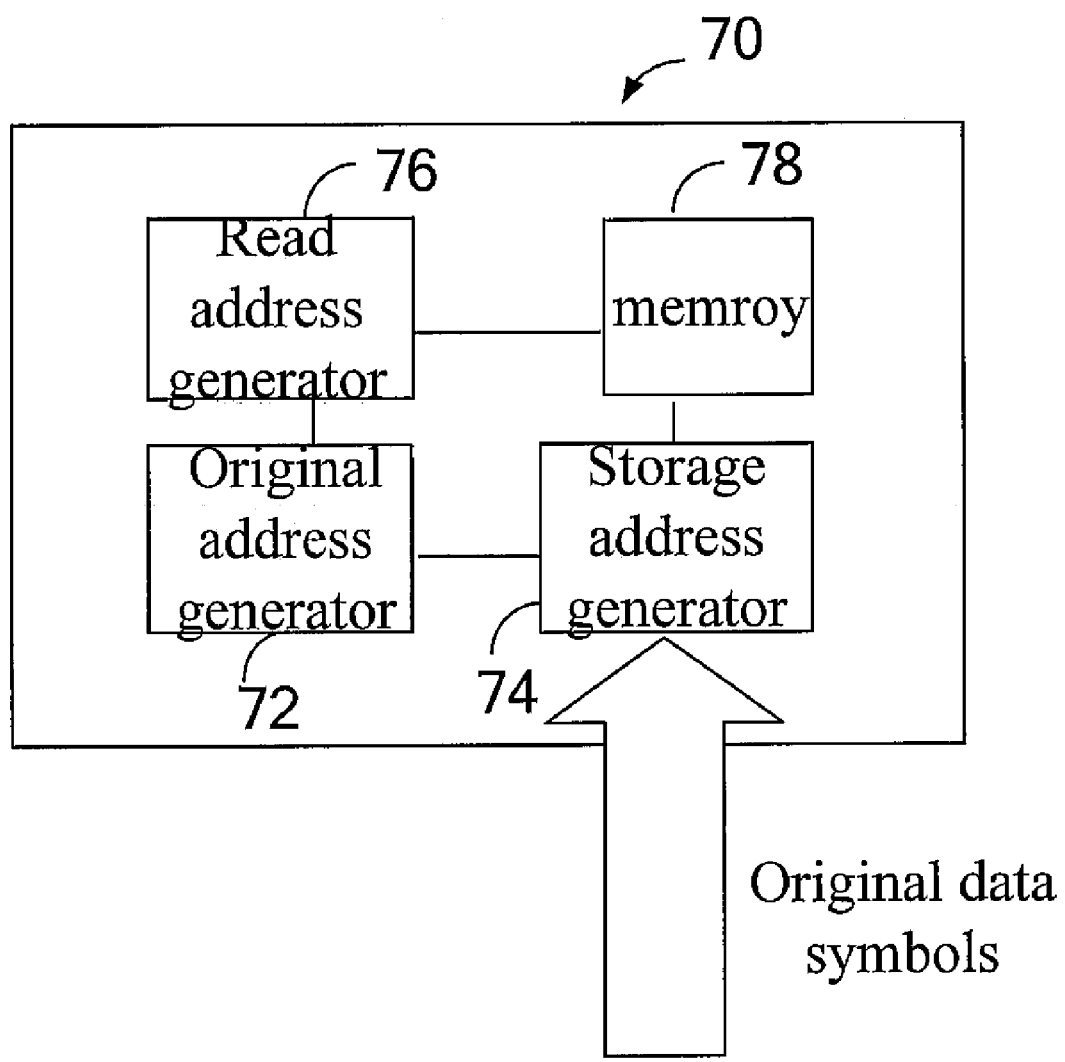
FIG. 9 is a block diagram of the processor for performing convolution interleaving on data symbols in the present invention.

The design of the invention can also be applied for performing the action of convolution interleaving on original data. Please refer to FIG. 9. FIG. 9 is a block diagram of the processor 70 for performing convolution interleaving on data symbols in the invention. The processor 70 of the embodiment is used for performing convolution interleaving on a plurality of original data symbols, wherein the processor 70 comprises a memory 78, an original address generator 72, a storage address generator 74, and a read address generator 76. The memory 78 stores each of the plural original data symbols that will undergo the action of convolution interleaving. The original address generator 72 generates an original address to store the first data symbol. The storage address generator 74 generates a storage address of each of the plural original data symbols stored in the memory 78 according to the original address and a fourth predetermined sequence, and it stores each of the plural original data symbols in the memory 78 according the storage address. The read address generator 76 completely reads out the stored data symbols in the memory 78 according to a fifth predetermined sequence.

Figure 10:
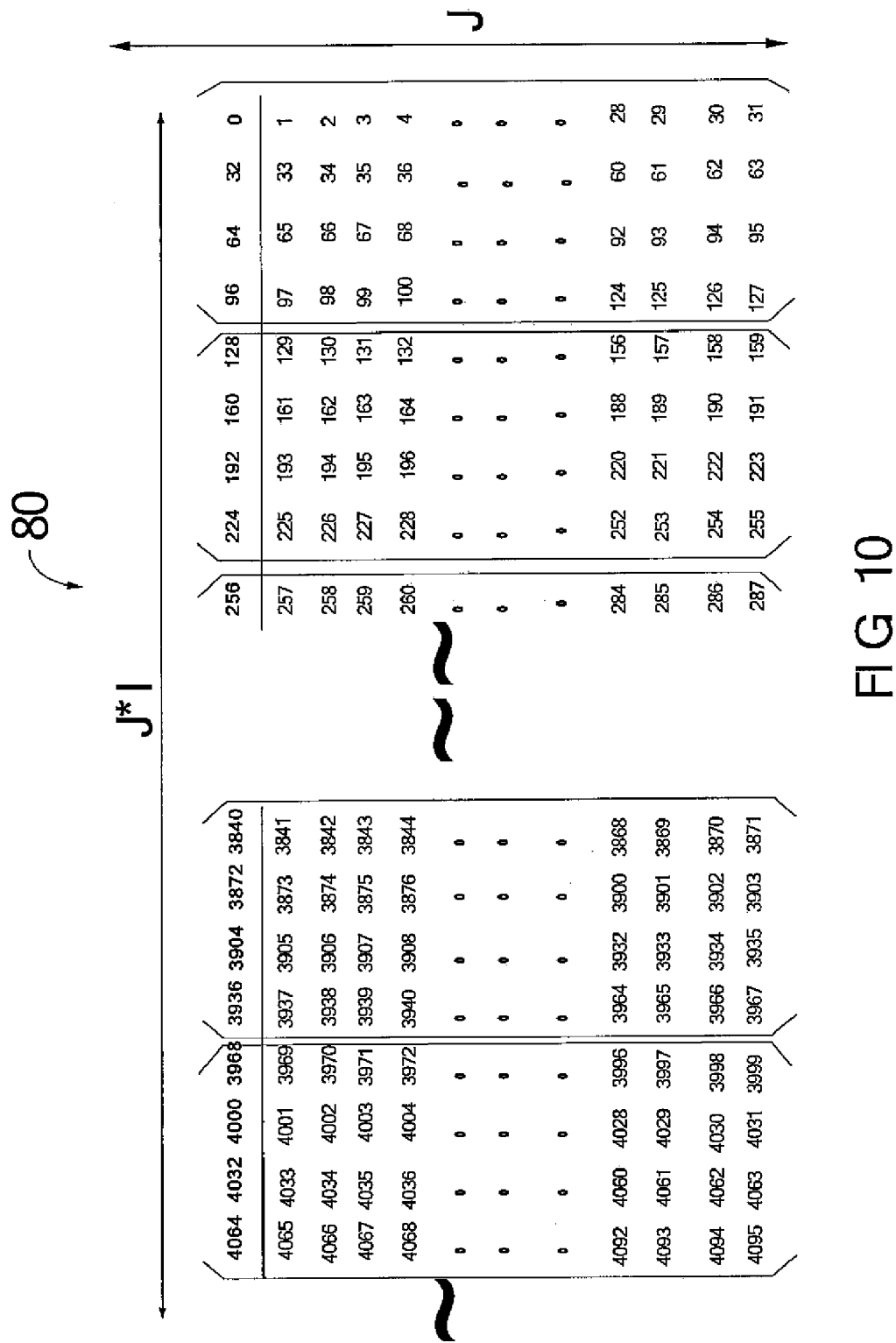
FIG. 10 is a schematic diagram of the original data input data block of the processor for performing convolution interleaving on data symbols in the present invention.

FIG. 10 is a schematic diagram of the original data block 80 of the processor 70 for performing convolution interleaving on data symbols in the invention. The original data block 80 comprises the original data symbols that will undergo convolution interleaving later on, and the number symbol is the sequence of the arrangement of the original data symbols. The original data block comprises more than J sub-matrixes. Each of the J sub-matrixes comprises J*I data symbols. J is the number of rows in each of the sub-matrixes. I is the number of columns in each of the sub-matrixes. According to the original data block 80 in FIG. 10, the number of the sub-matrixes depends on the data symbols to be de-interleaved. Each of the sub-matrixes comprises (32*4) data symbols wherein 32 is the number of rows of each sub-matrixes, and 4 is the number of columns of each sub-matrixes.

Figure 10B:
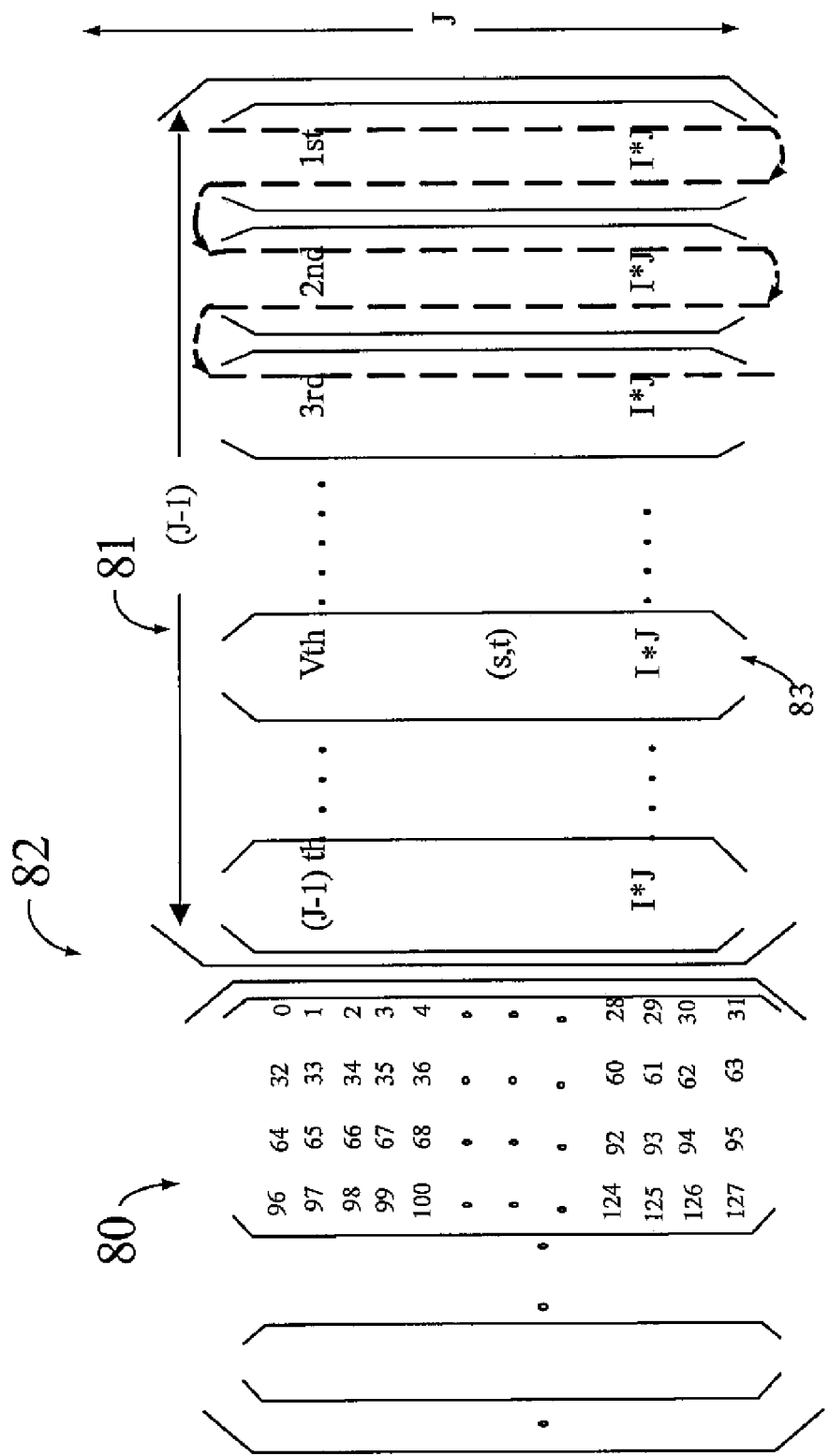
FIG. 10(b) is a schematic diagram of the corrected data matrix of the processor for performing convolution interleaving on data symbols in the present invention.

Before the processor 10 performs convolution interleaving on data symbols, if it is meant to correctly send out any of the interleaved data, (J-1) sub-matrixes 81 can be added in front of the original data block 80 that is to undergo convolution interleaving. Each of the sub-matrixes comprises J*I characters, and the element in each sub-matrix is "0" or any redundant characters. The added (J-1) sub-matrixes 81 together with the original data block 80 would form a amended data block 82. Please refer to FIG. 10(b). As shown in FIG. 10(b), the storage address of each element in the amended data block is obtained by adding (J-1) sub-matrixes to the original data block 80 according to the fourth predetermined sequence, and each element in each sub-matrix is "0". However, the sub-matrixes 81 is not necessary if we can tolerate the lost of some initial data bytes of data block 80.

Please refer to FIG. 10(b). In generating the storage address of each element in the amended data block 82, the fourth predetermined sequence inputs each element in the amended data block 82 into the processor 70 from top to bottom and from left to right according to the direction of the arrow in FIG. 10(b). Furthermore, the storage address generator 74 generates the storage address of each one data symbols stored in the memory 78 according to the fourth predetermined sequence, and the data symbols are stored in the corresponding memory 78. The data symbol of the s-th row and the t-th column in the v-th sub-matrix 83 in FIG. 10(b) is represented by the (s,t)-th data symbol, wherein s is any integer selected from 1 to J, and t is any integer selected from 1 to I. The storage address generator 74 generates the corresponding storage address according to the value of v, s, and t. When s=1, the storage address generator 74 generates the storage address of the (s,t)-th data symbol in the v-th sub-matrix 83 according to a fourth formula. The fourth formula is shown as:

The first row write address=the original address−
[((v−1)*I)+t−1];

When s=2~J, the storage address generator 74 generates the storage address of the (s,t)-th data symbol in the v-th sub-matrix according a fifth formula. The fifth formula is shown as:

$$\text{The storage address} = \text{the first row write address} + \left[\sum_{w=1}^{s-1} w\right] * I;$$

Therefore, the storage address of each element in the amended data block 82 can be generated, and the elements are stored in the memory 78 according to the fourth predetermined sequence.

Figure 11:
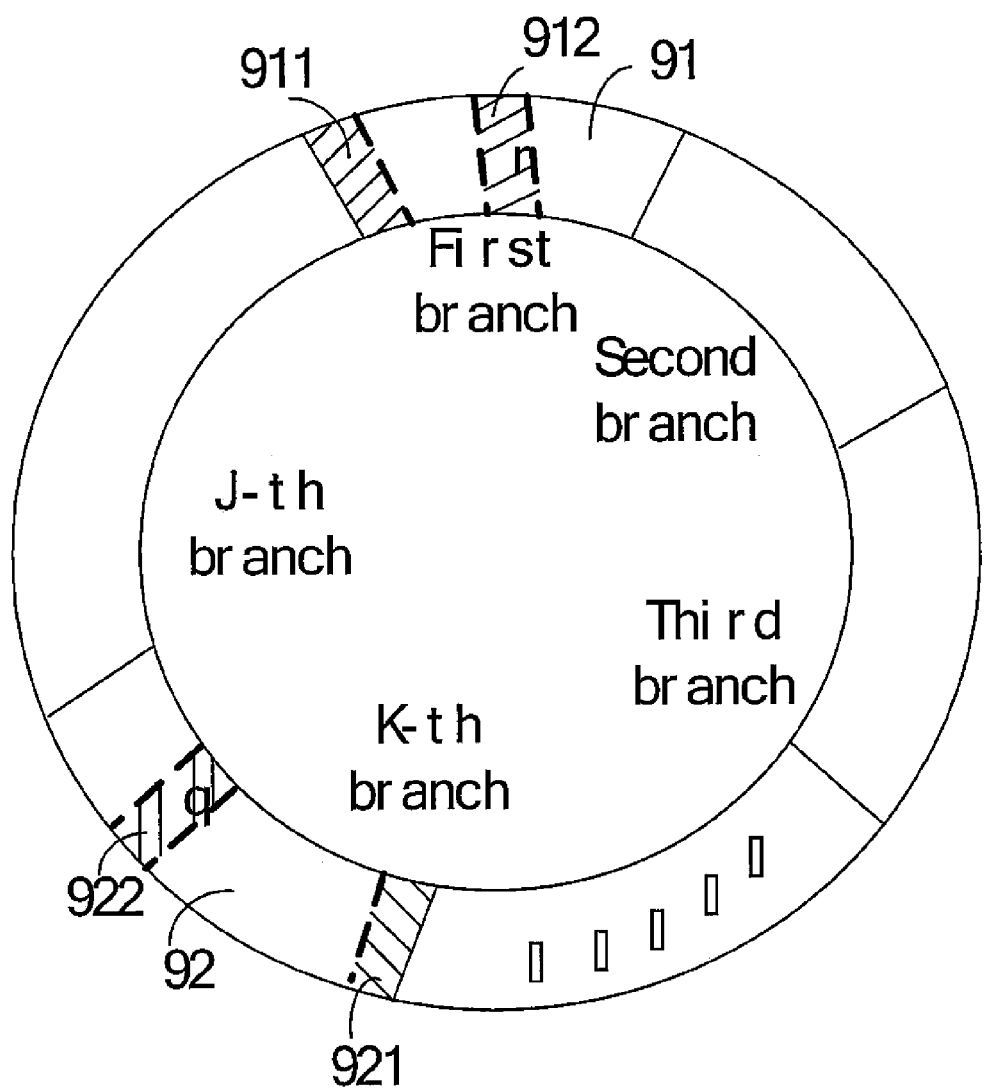
FIG. 11 is a schematic diagram of the address of the memory of the processor for performing the convolution interleaving on data symbols of the present invention.

Please refer to FIG. 11. FIG. 11 is a schematic diagram of the memory 78 configured in a circular data structure. In this embodiment, the memory 78 can be divided into J memory branches; the first memory branch 91 has I memory units, the second branch 92 has 2I memory units, and a J memory branch has I*J memory units. The J branches are configured into a circular data structure.

As shown in FIG. 11, the original address generated by the original address generator 72 is the address of the first memory unit 911 of the first memory branch 91. The address of the r-th memory unit 912 of the first memory branch 91 is obtained by adding (r−1) to the original address, wherein r is any integer selected form 1 to I. The address of the first memory unit 921 of the k-th memory branch 92 is obtained by adding $$\left[\sum_{p=1}^{k-1} p\right] * I$$

to the original address, and the address of the q-th memory unit 922 of the k-th memory branch 92 is obtained by adding $$\left\{\left[\sum_{p=1}^{k-1} p\right] * I + [q-1]\right\}$$

to the original address, wherein q is any integer selected form 1 to k*I.

The read address generator 76 generates plural read addresses according to the original address, a fifth predetermined sequence, and a sixth formula. Also, each of the stored data symbols in J memory branches is read according to the plural read addresses. The fifth predetermined sequence is mentioned in the following descriptions. First, the original address in the memory 78 starts to continually read one symbol for I times, then two symbols for I times, three symbols for I times, . . . , until reading J symbols for I times. In the reading of I*J symbols, it starts to read from the original address at the first time, then the original address−1 at the second time, . . . , and the original address−127 at the last time according to the sixth formula. The read address the z-th symbol of the yth time is mentioned described in the following:

$$\text{the read address} = [\text{original address} - (y-1)] + \left[\sum_{w=1}^{z-1} w + 1\right] * I;$$

whereby [original address−(y−1)] represents the original address of the yth time of reading, so that it can read the stored data symbols in the memory 78 according to the fifth predetermined sequence and the sixth formula.

Because each row of the complete set of data form is configured by J words, when the processor 78 reads one symbol of the I-th column at the first time, the data symbol is obtained by adding the redundant information of the size of I*(J−1) matrix to the symbol of the I-th column; when it reads the two symbols of the I-th column at the second time, the data symbol is obtained by adding the redundant information of the size of I*(J−2) matrix to the two symbols of the I-th column, . . . , in this way, when it reads the J words of the I-th column at the last time, the data symbol is obtained by adding the redundant information in sequence to complete the column where J words have not been read, and these are the convolution de-interleaved data symbols. In the above mentioned description, the process of performing convolution interleaving on data symbols is completed.

Figure 12:
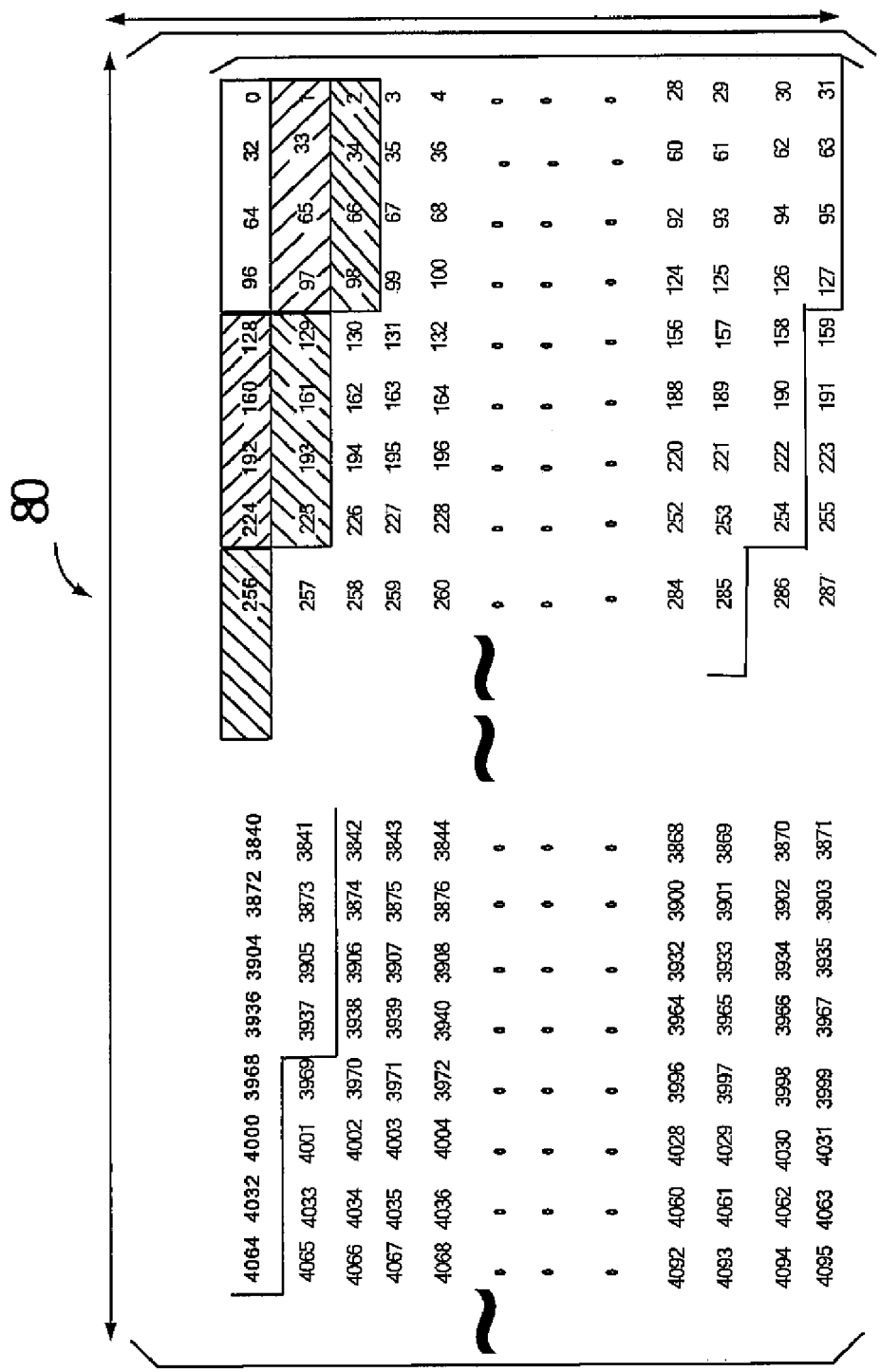
FIG. 12 is a schematic diagram of reading the data symbols in the memory of the processor for performing convolution interleaving on data symbols of the present invention.

As shown in FIG. 12 and in the embodiment of I=4 and J=32, FIG. 12 is a schematic diagram of the processor for performing convolution interleaving data symbol reading data symbols in the memory; the read address generator 76 reads one symbol for four times, then two symbols for four times, three symbols for four times, . . . , 32 symbols for four times, and so on. In the reading of 4*32 times, it starts at the original address at the first time, the original address−1 at the second time, the original address−2 at the third time, the original address−3 at the fourth time, and the original address−127 at the last time. The read address z symbols of the y-th time is shown as:

$$\text{the read address} = [\text{original address} - (y-1)] + \left[\sum_{w=1}^{z-1} w + 1\right] * I,$$

wherein [original address−y−1)] represents the original address when reading the y-th time;

Each of the columns is composed of 32 words in this embodiment. When the processor 10 reads one symbol of the fourth column, the data symbol is obtained by adding the redundant information of the size of 4*(32−1) matrix to the symbol of the fourth column; when it reads the two symbols of the fourth column, the data symbol is obtained by adding the redundant information of the size of 4*(32−2) matrix to the two symbols of the fourth column, . . . , when it reads 32 symbols of the fourth column, the data symbol is obtained by adding the redundant information in sequence to complete the column where 32 words have not been read the fourth column of complete 32 symbols. These are the convolution de-interleaved data symbols. In this way, data format of FIG. 5(*b*) is obtained, and the process of convolution interleaving data symbol is finished.

Because the general data is a sequence of consecutive data, the actual convolution interleaving/de-interleaving of data is not the same as that shown in FIG. 4 and FIG. 10, where the amount of data is exactly what the memory capacity can hold. FIG. 4 is only used to show in the flow of the embodiment in the invention. In real operation, the processor 10 for performing convolution interleaving/de-interleaving on data symbol can process more data than the capacity the memory 18. When the memory 18 is filled by data symbols, the processor 10 first reads a data symbol immediately, and then it writes in a new data symbol that has not been processed by the processor 10 for performing convolution interleaving/de-interleaving on data symbols. Therefore, utilizing this method, convolution interleaving/de-interleaving can be performed on a complete sequence of data symbols.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A convolution de-interleaving data symbol processor for performing convolution de-interleaving on a plurality of convolution interleaved data symbols, the processor comprising:
   a memory;
   an original address generator for generating an original address; and
   a storage address generator for generating a storage address for each of the plural convolution interleaved data symbols to be stored in the memory according to the original address and a first predetermined sequence, each of the plural convolution interleaved data symbols then being stored in the memory according to the storage address;
   wherein the plural convolution interleaving data symbols stored in the memory are configured into a circular data structure.

2. The processor of claim 1, wherein the plural convolution interleaved data symbols are configured in an input data block comprising more than J sub-matrixes, wherein a k-th sub-matrix of the J sub-matrixes comprises J*I data symbols, where k is any integer selected from 1 to J, J is the number of rows in the k-th sub-matrix, and I is the number of columns in the k-th sub-matrix.

3. The processor of claim 2, wherein the memory comprises J memory branches, and a k-th memory branch of the J memory branches comprises (J−k+1)*I memory units when the processor acts as a de-interleaving processor.

4. The processor of claim 3, wherein the original address is the address of the first memory unit of the first memory branch, and the address of an r-th memory unit of the first memory branch is obtained by subtracting the original address by (r−1), wherein r is an integer selected form 1 to J*I, the address of the first memory unit of the k-th memory branch is obtained by adding $$\left[\sum_{p=1}^{k-1}(J-p)\right]*I$$

to the original address, the address of the q-th memory unit of the k-th memory branch is obtained by adding $$\left\{\left[\sum_{p=1}^{k-1}(J-p)\right]*I-[q-1]\right\}$$

to the original address, and q is any integer selected form 1 to (J−k+1)*I.

5. The processor of claim 4, wherein the storage address generator receives each data symbol of the J sub-matrixes according to the first predetermined sequence and generates a storage address of the (s,t)-th data symbol of the k-th sub-matrix, and the (s,t)-th data symbol is stored in the memory, wherein s is any integer selected from 1 to J, and t is any integer selected form 1 to I, and wherein
   when s=1, the storage address generator generates the storage address of the (s,t)-th data symbol of the k-th sub-matrix according to a first formula; and
   when s=2~J, the storage address generator generates the storage address of the (s,t)-th data symbol of the k-th sub-matrix according to a second formula;
   whereby the plural convolution interleaved data symbols stored in the memory are configured into a circular data structure.

6. The processor of claim 5, wherein the first formula is: the storage address=the original address−[((k−1)*I)+t−1], and the second formula is:

$$\text{the storage address} = \text{the original address} + \left[\sum_{w=1}^{s-1}(J-w+1)\right]*I.$$

7. The processor of claim 6, wherein the processor further comprises a read address generator being connected to the memory for generating plural read addresses according to the original address, a second predetermined sequence, and a third formula, and for reading every data symbol stored in the J memory branches according to the plural read addresses.

8. The processor of claim 5, wherein the first formula is: a first row write address=a first row write address in a previous column minus 1, and the second formula is: the storage address=a previous storage address plus a fixed decremental offset.

9. The processor of claim 5, wherein the fixed decremental offset in the second formula is (J−w+1)*I.

10. The processor of claim 2, wherein the memory comprises (J−1) memory branches, and a v-th memory branch of the (J−1) memory branches comprises (J−v+1)*I memory units, wherein v is any integer selected from 1 to J−1.

11. A convolution de-interleaving data symbol method for performing convolution de-interleaving on plural convolution interleaved data symbols, the method comprising:
   generating an original address;
   receiving each of the plural convolution interleaved data symbols according to a first predetermined sequence;
   generating a storage address for each of the plural convolution interleaved data symbols to be stored in the memory according to the original address and the first predetermined sequence, and storing every data symbol;
   wherein the plural convolution interleaved data symbols stored in the memory are configured into a circular data structure.

12. The method of claim 11, wherein the plural convolution interleaved data symbols are configured in an input data block comprising J sub-matrixes; the k-th sub-matrix of J sub-matrixes comprises J*I data symbols, wherein k is any integer selected from 1 to J, J is the number of rows in the k-th sub-matrix, and I is the number of columns in the k-th sub-matrix.

13. The method of claim 12, wherein the memory comprises J memory branches, and a the k-th memory branch of the J memory branches comprises (J−k+1)*I memory units.

14. The method of claim 13, wherein the original address is the address of the first memory unit of the first memory branch, and the address of an r-th memory unit of the first memory branch is obtained by subtracting the original address by (r−1), wherein r is any integer selected form 1 to J*I; the address of the first memory unit of the k-th memory branch is obtained by adding $$\left[\sum_{p=1}^{k-1}(J-p)\right]*I$$

to the original address, and the address of the q-th memory unit of the k-th memory branch is obtained by adding $$\left\{\left[\sum_{p=1}^{k-1}(J-p)\right]*I-[q-1]\right\}$$

to the original address, wherein q is any integer selected from 1 to (J−k+1)*I.

15. The method of claim 14, wherein the storage address generator receives each data symbol of the J sub-matrixes according to the first predetermined sequence and generates a storage address of the (s,t)-th data symbol of the k-th sub-matrix, and stores the (s,t)-th data symbol in the memory, wherein s is any integer selected from 1 to J, and t is any integer selected from 1 to I, and wherein
when s=1, the storage address generator generates storage address of the (s,t)-th data symbol of the k-th sub-matrix according to a first formula; and
when s=2~J, the storage address generator generates storage address of the (s,t)-th data symbol of the k-th sub-matrix according to a second formula;
whereby the plural convolution interleaved data symbols stored in the memory are configured in a circular data structure.

16. The method of claim 15, wherein the first formula is: the storage address=the original address−[((k−1)*I)+t−1], and the second formula is:

$$\text{the storage address}=\text{the original address}+\left[\sum_{w=1}^{s-1}(J-w+1)\right]*I.$$

17. The method of claim 16, wherein the processor further comprises a read address generator being connected to the memory for generating plural read addresses according to the original address, a second predetermined sequence, and a third formula, and for reading every data symbol stored in the J memory branches according to the plural read address.

18. The method of claim 12, wherein the memory comprises (J−1) memory branches, and the v-th memory branch of the (J−1) memory branches comprises (J−v+1)*I memory units, wherein v is any integer selected from 1 to J−1.

19. A convolution interleaving data symbol processor for performing convolution interleaving on plural original data symbols, the processor comprising:
a memory;
an original address generator for generating an original address; and
a storage address generator for generating a storage address for each of the plural original data symbols to be stored in the memory according to the original address and a fourth predetermined sequence; and
wherein the plural data symbols stored in the memory are configured into a circular data structure.

20. The processor of claim 19, wherein the memory comprises J sub-matrixes; a k-th memory branch of J memory branches comprises k*I memory units, wherein k is any integer selected from 1 to J.

21. The processor of claim 20, wherein the original address is the address of the first memory unit of the first memory branch, and the address of an r-th memory unit of the first memory branch is obtained by adding (r−1) to the original address, wherein r is an integer selected form 1 to I; the address of the first memory unit of k-th memory branch being original address adding $$\left[\sum_{p=1}^{k-1}p\right]*I,$$

the address of q-th memory unit of the k-th memory branch is obtained by adding $$\left\{\left[\sum_{p=1}^{k-1}p\right]*I+[q-1]\right\}$$

to the original address, wherein q is any integer selected form 1 to k*I.

22. The processor of claim 19, wherein the plural original data symbols are configured in an input data block comprising more than J sub-matrixes; the input data block and (J−1)*(J*I) redundant characters are configured into an amended data block; the storage address generator generates the storage address of the (s,t)-th data symbol of the v-th sub-matrix of the amended data block according to the fourth predetermined sequence, and it stores the (s,t)-th data symbol in the memory, wherein v is any integer selected from 1 to J+(J−1), s is any integer selected form 1 to J, and t is any integer selected from 1 to I; and
when s=1, the storage address generator generates the storage address of the (s,t)-th data symbol of the v-th sub-matrix according to a fourth formula; and
when s=2~J, the storage address generator generates the storage address of the (s,t)-th data symbol of the v-th sub-matrix according to a fifth formula;
whereby the plural convolution interleaved data symbols stored in the memory are configured into a circular data structure.

23. The processor of claim 22, wherein the fourth formula is: the storage address=the original address−[((v−1)*I)+t−1], and the fifth formula is:

$$\text{the storage address}=\text{the original address}+\left[\sum_{w=1}^{s-1}w\right]*I.$$

24. The processor of claim 22, wherein the processor further comprises a read address generator being connected to the memory for generating plural read addresses according to the original address, a fifth predetermined sequence, and a sixth formula, and for reading every data symbol stored in the J memory branches according to the plural read addresses; therefore, every time it reads the plural symbols according to the sixth formula, the read address of the z-th symbol of the y-th time is shown as:

$$\text{the read address} = [\text{original address} - (y-1)] + \left[\sum_{w=1}^{z-1} w + 1\right] * I;$$

whereby [original address−(y−1)] is the original address of reading the y-th time.

25. A convolution interleaving data symbol method for performing convolution interleaving on plural original data symbols, the method comprising:
    generating an original address;
    forming an amended data block based on the plural data symbols; and
    generating a storage address for each of the plural original data symbols to be stored in the memory according to the original address, the amended data block, and a fourth predetermined sequence, and storing each of the data symbols;
    wherein the plural original data symbols stored in the memory are configured into a circular data structure.

26. The method of claim 25, wherein the amended data block is formed by adding a redundant matrix before the plural data symbols.

27. The method of claim 25, the memory comprises J memory branches, and a k-th memory branch of J memory branches comprises k*I memory units, wherein k is any integer selected from 1 to J.

28. The method of claim 27, wherein the original address is the address of the first memory unit of the first memory branch, and the address of an r-th memory unit of the first memory branch is obtained by adding (r−1) to the original address, wherein r is any integer selected form 1 to I; the address of the first memory unit of the k-th memory branch is obtained by adding $$\left[\sum_{p=1}^{k-1} p\right] * I$$

to the original address, and the address of the q-th memory unit of the k-th memory branch is obtained by adding $$\left\{\left[\sum_{p=1}^{k-1} p\right] * I + [q-1]\right\}$$

to the original address, wherein q is any integer selected form 1 to k*I.

29. The method of claim 26, wherein the plural original data symbols are J set of (J*I)-th sub-matrix, the redundant matrix comprises (J−1)*(J*I) redundant characters, and the correction matrix comprises J+(J−1) set of the (J*I)-th matrix.

30. The method of claim 29, wherein in the steps to generate the storage address of each original data symbols, the storage address of the (s,t)-th data symbol of the v-th matrix of the amended data block is generated according to the fourth predetermined sequence, and wherein v is any integer selected from 1 to J+(J−1), s is any integer selected from 1 to J, and t is any integer selected from 1 to I; and
    when s=1, the storage address generator generates the storage address of the (s,t)-th data symbol of the v-th sub-matrix according to a fourth formula; and
    when s=2~J, the storage address generator generates the storage address of the (s,t)-th data symbol of the v-th sub-matrix according to a fifth formula;
    whereby the plural convolution interleaved data symbol stored in the memory are configured into a circular data structure.

31. The method of claim 30, wherein the four formula is: the storage address=the original address−[((v−1)*I)+t−1], and the fifth formula is:

$$\text{the storage address} = \text{the original address} + \left[\sum_{w=1}^{s-1} w\right] * I.$$

32. The method of claim 27, wherein the processor further comprises a read address generator being connected to the memory for generating plural read addresses according to the original address, a fifth predetermined sequence, and a sixth formula, and for reading every data symbol stored in the J memory branches according to the plural read addresses; therefore, every time it reads the plural symbols according to the sixth formula, the read address of the z-th symbol of the y-th time is shown as:

$$\text{the read address} = [\text{original address} - (y-1)] + \left[\sum_{w=1}^{z-1} w + 1\right] * I;$$

wherein [original address−(y−1)] represents the original address of reading the y-th time.

* * * * *